United States Patent
Ariga et al.

(10) Patent No.: US 11,552,455 B2
(45) Date of Patent: Jan. 10, 2023

(54) SEMICONDUCTOR LASER MODULE

(71) Applicant: FURUKAWA ELECTRIC CO., LTD., Tokyo (JP)

(72) Inventors: Maiko Ariga, Tokyo (JP); Yusuke Inaba, Tokyo (JP); Kazuki Yamaoka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 801 days.

(21) Appl. No.: 16/437,465

(22) Filed: Jun. 11, 2019

(65) Prior Publication Data

US 2019/0296524 A1 Sep. 26, 2019

Related U.S. Application Data

(63) Continuation of application No. PCT/JP2017/045458, filed on Dec. 19, 2017.

(30) Foreign Application Priority Data

Dec. 22, 2016 (JP) .............................. JP2016-250075

(51) Int. Cl.
*H01S 5/50* (2006.01)
*H01S 5/0683* (2006.01)
(Continued)

(52) U.S. Cl.
CPC .......... *H01S 5/509* (2013.01); *G02B 27/0955* (2013.01); *G02B 27/10* (2013.01);
(Continued)

(58) Field of Classification Search
CPC ...... H01S 5/509; H01S 5/0085; H01S 5/0267; H01S 5/0683; H01S 5/02251;
(Continued)

(56) References Cited

U.S. PATENT DOCUMENTS 7,978,737 B2 7/2011 De Gabory et al.
9,054,480 B2 6/2015 Daiber
(Continued)

FOREIGN PATENT DOCUMENTS

CN 102474067 A 5/2012
CN 103557936 A 2/2014
(Continued)

OTHER PUBLICATIONS

International Search Report dated Mar. 13, 2018 in PCT/JP2017/045458 filed Dec. 19, 2017 (with English Translation).
(Continued)

*Primary Examiner* — Xinning(Tom) Niu
(74) *Attorney, Agent, or Firm* — Oblon, McClelland, Maier & Neustadt, L.L.P.

(57) ABSTRACT

A disclosed semiconductor laser module includes a semiconductor laser device; a semiconductor optical amplifier configured to receive laser light emitted from the semiconductor laser device and amplify the laser light that has been received; and a first light receiving device that measures an intensity of a part of the laser light emitted from the semiconductor laser device, for monitoring a wavelength of the laser light, wherein the semiconductor optical amplifier is located rearward in relation to a light receiving surface of the first light receiving device along a propagation direction of the laser light emitted from the semiconductor device.

6 Claims, 4 Drawing Sheets

(51) Int. Cl.
  *G02B 27/09* (2006.01)
  *G02B 27/10* (2006.01)
  *G02B 27/30* (2006.01)
  *H01S 5/00* (2006.01)
  *H01S 5/026* (2006.01)

(52) U.S. Cl.
  CPC ............ *G02B 27/30* (2013.01); *H01S 5/0085* (2013.01); *H01S 5/0267* (2013.01); *H01S 5/0683* (2013.01)

(58) Field of Classification Search
  CPC ...... H01S 5/02326; H01S 5/4025; H01S 5/50; H01S 2301/02; H01S 5/0612; H01S 5/0687; H01S 5/02415; H01S 5/02438; G02B 27/0955; G02B 27/10; G02B 27/30
  See application file for complete search history.

(56) References Cited

U.S. PATENT DOCUMENTS

| | | |
|---|---|---|
| 9,203,212 B2 | 12/2015 | Kurobe et al. |
| 2001/0019562 A1 | 9/2001 | Kai et al. |
| 2003/0039276 A1* | 2/2003 | Tatsuno ............... H01S 5/0687 372/31 |
| 2003/0039277 A1* | 2/2003 | Nasu .................. H01S 5/02251 372/32 |
| 2005/0036535 A1* | 2/2005 | Knopp ................ H01S 5/02251 372/92 |
| 2009/0129427 A1* | 5/2009 | Ariga ................. H01S 5/02208 372/108 |
| 2009/0262762 A1* | 10/2009 | Sasaki ................. H01S 5/0687 372/20 |
| 2011/0310916 A1* | 12/2011 | Kimoto ................ H01S 5/4025 372/29.016 |
| 2012/0127715 A1 | 5/2012 | Ariga et al. |
| 2015/0103853 A1* | 4/2015 | Kurobe ................ H01S 5/024 372/34 |

FOREIGN PATENT DOCUMENTS

| | | |
|---|---|---|
| JP | 2001-251013 | 9/2001 |
| JP | 2006-216695 | 8/2006 |
| JP | 2006-216791 | 8/2006 |
| WO | WO 2013/180291 A1 | 12/2013 |

OTHER PUBLICATIONS

Written Opinion dated Mar. 13, 2018 in PCT/JP2017/045458 filed Dec. 19, 2017.

Combined Chinese Office Action and Search Report dated Jun. 15, 2020 in Chinese Patent Application No. 201780078795.X (with unedited computer generated English translation and English translation of Category of Cited Documents), citing documents AO and AP therein, 13 pages.

* cited by examiner

SEMICONDUCTOR LASER MODULE

CROSS-REFERENCE TO RELATED APPLICATION(S)

This application is a continuation of International Application No. PCT/JP2017/045458, filed on Dec. 19, 2017 which claims the benefit of priority of the prior Japanese Patent Application No. 2016-250075, filed on Dec. 22, 2016, the entire contents of which are incorporated herein by reference.

BACKGROUND

The present disclosure relates to a semiconductor laser module.

Some semiconductor laser modules used as light sources for optical communication are configured of a semiconductor laser device (LD) and a semiconductor optical amplifier (SOA) for amplifying laser light emitted from the semiconductor laser device (LD). With such configuration, high output power laser light can be output from the semiconductor laser module. Additionally, in some semiconductor laser modules, the semiconductor laser device and the semiconductor optical amplifier are integrated into one device (for example, Japanese Unexamined Patent Application Publications Nos. 2006-216791 and 2006-216695, U.S. Pat. No. 9,054,480, and International Patent Publication No. WO 2013/180291).

In recent years, a demand for higher output power is increasing in optical communication, and the electric current to be supplied to semiconductor laser devices and semiconductor optical amplifiers is also increasing. As a result, an amount of heat generated from semiconductor laser devices and semiconductor optical amplifiers has also increased. Under such circumstances, there is also an increasing need for a configuration of a semiconductor laser module where temperatures of the semiconductor laser device and the semiconductor optical amplifier are independently controlled. When the temperatures of the semiconductor laser device and the semiconductor optical amplifier are independently controlled by using corresponding thermoelectric devices, consumed power in the temperature control by the thermoelectric devices can be saved in total.

Additionally, due to the increase in the output, stray light in the semiconductor laser module has also increased. When an intensity of stray light in the semiconductor laser module is increased, noise arising from the stray light will be included in monitoring the laser light emitted from the semiconductor laser device, and accurate control will thereby be hindered. In the configuration having the semiconductor laser device and the semiconductor optical amplifier separated from each other, stray light emitted from the semiconductor optical amplifier particularly becomes significantly problematic. This is because amplified spontaneous emission light emitted from the semiconductor optical amplifier due to the increase in the output is increased, and the amplified spontaneous emission light emitted from the semiconductor optical amplifier that has been arranged separately results in stray light without being shielded by another structure.

SUMMARY

According to an aspect of the present disclosure, a semiconductor laser module is provided which includes a semiconductor laser device; a semiconductor optical amplifier configured to receive laser light emitted from the semiconductor laser device and amplify the laser light that has been received; and a first light receiving device that measures an intensity of a part of the laser light emitted from the semiconductor laser device, for monitoring a wavelength of the laser light, wherein the semiconductor optical amplifier is located rearward in relation to a light receiving surface of the first light receiving device along a propagation direction of the laser light emitted from the semiconductor device.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Hereinafter, by reference to the drawings, a semiconductor laser module according to an embodiment of the present disclosure will be described in detail. The present disclosure is not limited by the embodiment described below. Furthermore, any components that are the same as or corresponding to each other are assigned with the same reference sign, as appropriate, throughout the drawings. Moreover, the drawings are schematic, and dimensions of each component may be different from the actual ones. In addition, a portion having different dimensional relations and ratios among the drawings may be included.

Preliminary Experiments

Described first of all are preliminary experiments that lead to conception of a configuration of the semiconductor laser module according to the embodiment of the present disclosure.

Semiconductor optical amplifiers emit spontaneous emission light even when laser light is not incident thereon from the exterior thereof. Furthermore, the semiconductor optical amplifiers amplify the spontaneous emission light by their own function, and as a result, amplified spontaneous emission light (hereinafter, referred to as "ASE light") is emitted.

Such ASE light emitted from a semiconductor optical amplifier has been considered to be emitted at a certain emission angle from a facet of a waveguide in the semiconductor optical amplifier. However, the preliminary experiments described below indicate that the ASE light is not necessarily emitted at a certain emission angle from the facet of the waveguide.

FIG. 1A to FIG. 1E are diagrams illustrating arrangements of a light receiving device used in the preliminary experiments. In the preliminary experiments, whether or not the ASE light from a semiconductor optical amplifier 1 was detected by a light receiving device 2 in five kinds of arrangements illustrated in FIG. 1A to FIG. 1E was investigated. Each rectangle illustrated in FIG. 1A to 1E corresponds to a submount 3 where the semiconductor optical amplifier 1 is fixed, and the light receiving device 2 used in the experiments is a photodiode generally used also in semiconductor laser modules.

Figure 1A:
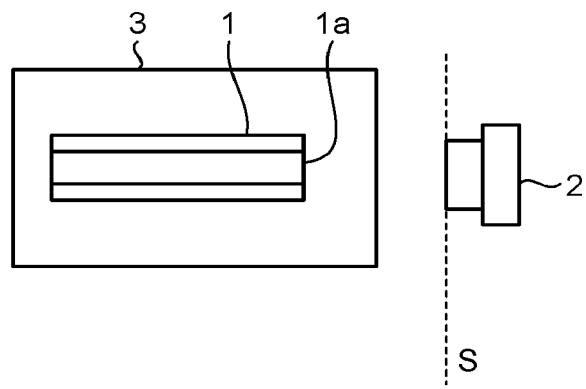
FIG. 1A is a diagram illustrating an arrangement of a light receiving device used in a preliminary experiment.

As illustrated in FIG. 1A, when the light receiving device 2 is arranged such that a front of the light receiving surface S faces a facet 1a of a waveguide of the semiconductor optical amplifier 1 as illustrated in FIG. 1A, ASE light from the semiconductor optical amplifier 1 is detected by the light receiving device 2.

Figure 1B:
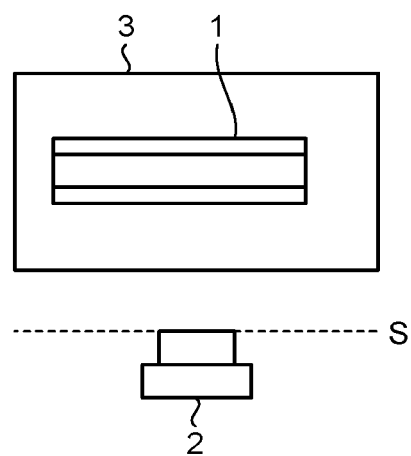
FIG. 1B is a diagram illustrating another arrangement of the light receiving device used in a preliminary experiment.
Figure 1C:
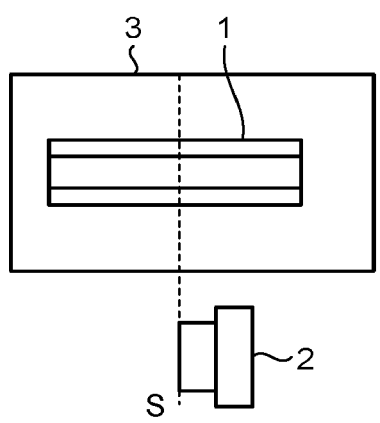
FIG. 1C is a diagram illustrating yet another arrangement of the light receiving device used in a preliminary experiment.

When the light receiving device 2 is arranged such that the front of the light receiving surface S thereof faces a side surface of the semiconductor optical amplifier (and a side surface of the waveguide) as illustrated in FIG. 1B, ASE light from the semiconductor optical amplifier 1 is also detected by the light receiving device 2. Furthermore, when the light receiving device 2 is arranged such that the light receiving surface S thereof faces toward a direction in parallel with an optical axis direction of the semiconductor optical amplifier 1 as illustrated in FIG. 1C, ASE light from the semiconductor optical amplifier 1 is also detected by the light receiving device 2. These results cannot be explained if ASE light is considered to be emitted at a certain emission angle from a facet of a waveguide.

Figure 1D:
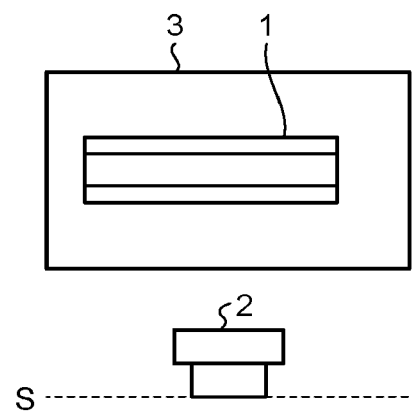
FIG. 1D is a diagram illustrating still another arrangement of the light receiving device used in a preliminary experiment.
Figure 1E:
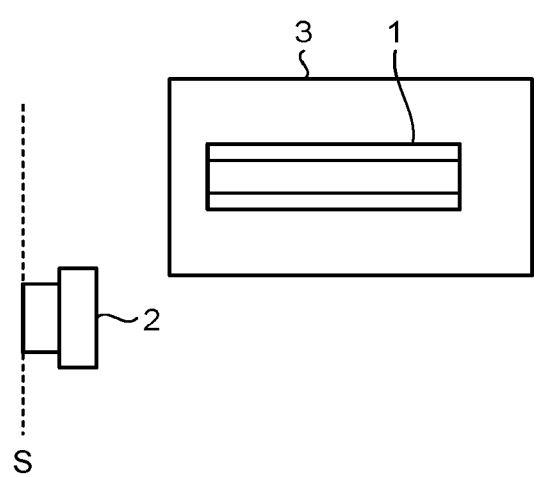
FIG. 1E is a diagram illustrating another arrangement of the light receiving device used in a preliminary experiment.

However, as illustrated in FIG. 1D or FIG. 1E, when the light receiving device 2 is arranged such that the light receiving surface S thereof faces away from the semiconductor optical amplifier 1, ASE light from the semiconductor optical amplifier 1 is not detected by the light receiving device 2.

Figure 2:
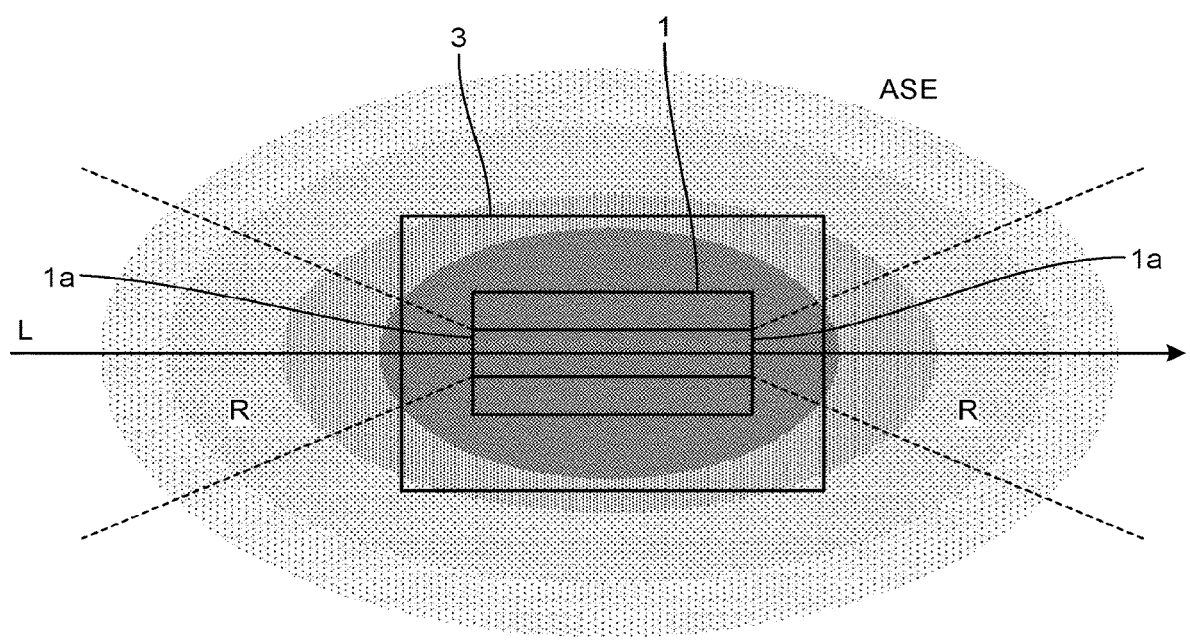
FIG. 2 is a diagram schematically illustrating ASE light emitted from a semiconductor optical amplifier.

Properties of ASE light emitted from a semiconductor optical amplifier will be described based on the above described preliminary experiments with reference to FIG. 2. FIG. 2 is a diagram schematically illustrating ASE light emitted from a semiconductor optical amplifier.

ASE light emitted from the semiconductor optical amplifier 1 has been considered to be emitted at a certain emission angle from the facet 1a of the waveguide and propagates through a region R between broken lines illustrated in FIG. 2. However, the above preliminary experiments indicated that ASE light is not necessarily emitted from the facet 1a of the waveguide and is also emitted from the whole semiconductor optical amplifier 1.

That is, although ASE light emitted from the semiconductor optical amplifier 1 has been considered to be nonproblematic unless a light receiving device is arranged in the region R in a semiconductor laser module, countermeasures for ASE light emitted from the semiconductor optical amplifier 1 are actually required even if a light receiving device is arranged outside the region R. That is, ASE light emitted from any position on the outer periphery of the semiconductor optical amplifier 1 is desired to be not directly incident on a light receiving device.

The configuration of the semiconductor laser module according to the embodiment of the present disclosure, which is based on the above described findings, will be described below.

Embodiment

Figure 3:
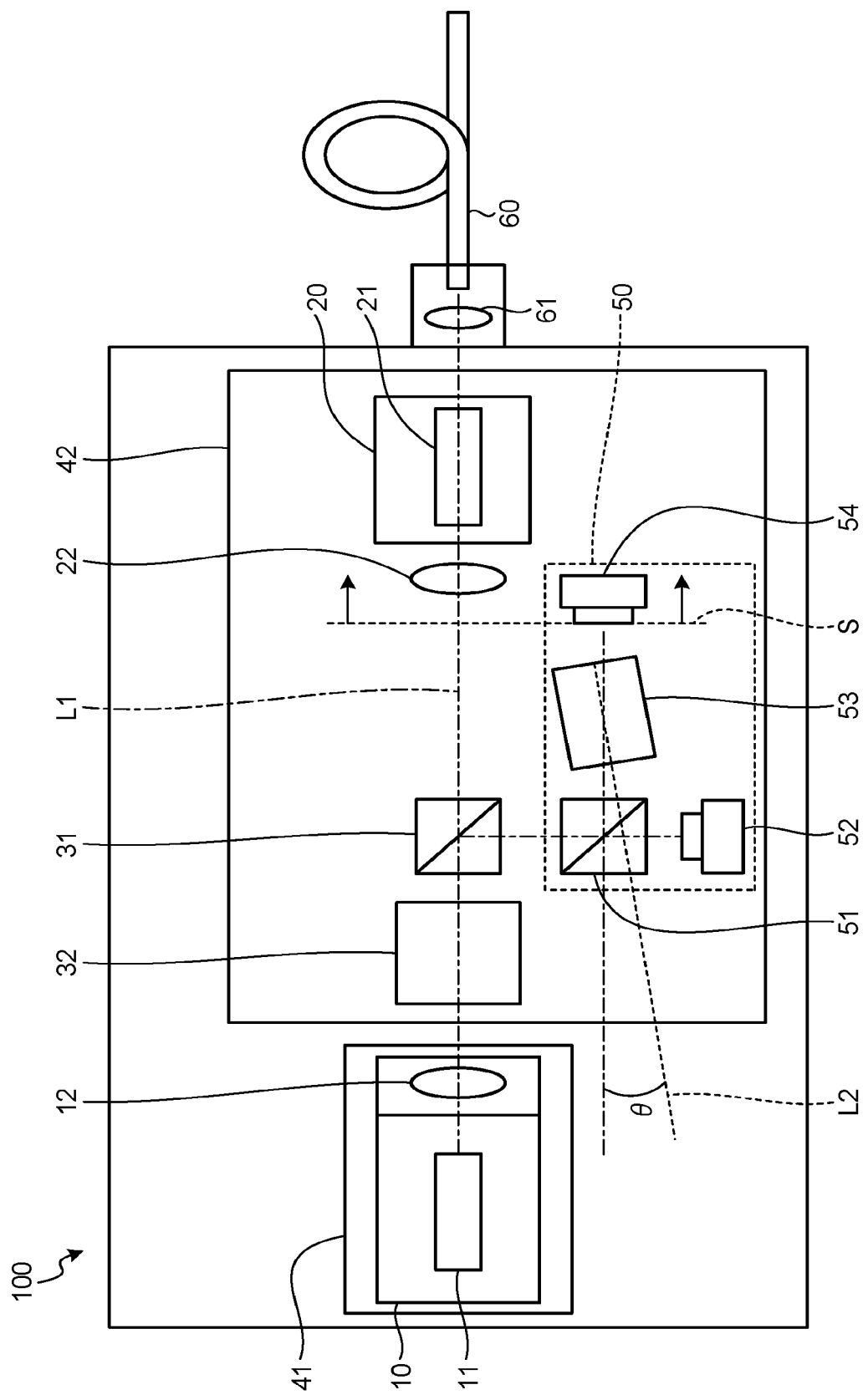
FIG. 3 is a diagram illustrating a schematic configuration of a semiconductor laser module according to an embodiment.

FIG. 3 is a diagram illustrating a schematic configuration of the semiconductor laser module according to the embodiment.

As illustrated in FIG. 3, a semiconductor laser module 100 according to the embodiment includes: a semiconductor laser device 11; and a semiconductor optical amplifier 21 that receives laser light emitted from the semiconductor laser device 11 and amplifies the laser light that has been received.

The semiconductor laser device 11 generates the laser light when electric current is injected thereto and emits the laser light therefrom. The semiconductor laser device 11 is, for example but not limited to, a distributed feedback semiconductor laser device that enables a wavelength of the laser light to be changed by temperature control. Furthermore, the semiconductor laser device 11 is arranged, together with a collimator lens 12, on a laser diode (LD) submount 10, and the LD submount 10 is arranged on a laser diode (LD) thermoelectric device 41.

The LD thermoelectric device 41 is, for example, a Peltier device, and is able to heat and cool the semiconductor laser device 11 according to an amount of and a direction of electric current supplied to the LD thermoelectric device 41. As described above, the semiconductor laser device 11 is a distributed feedback semiconductor laser device that enables the emission wavelength to be changed by temperature control; and the wavelength of the laser light emitted from the semiconductor laser device 11 is able to be controlled by controlling the amount and direction of the electric current supplied to the LD thermoelectric device 41.

The semiconductor optical amplifier 21 is fixed onto an SOA submount 20, and the SOA submount 20 is arranged on an SOA thermoelectric device 42. The SOA thermoelectric device 42 is, for example, a Peltier device, and is able to heat and cool the semiconductor optical amplifier 21 according to an amount and a direction of electric current supplied to the SOA thermoelectric device 42. Note that the semiconductor optical amplifier 21 generates a relatively large amount of heat, and thus is rarely actively heated. Anyhow, since the semiconductor laser module 100 having this configuration includes the LD thermoelectric device 41 used in the temperature control of the semiconductor laser device 11 and the SOA thermoelectric device 42 used in the temperature control of the semiconductor optical amplifier 21 independently from each other, a temperature of each of the semiconductor laser device 11 and the semiconductor optical amplifier 21 is able to be controlled optimally. That is, wasteful consumption of power in the temperature control of the semiconductor laser device 11 and the semiconductor optical amplifier 21 is also able to be reduced, and the total power consumption by the LD thermoelectric device 41 and the SOA thermoelectric device 42 is also able to be maintained low.

The collimator lens 12 is an optical element that functions together with a collective lens 22. The collimator lens 12 and the collective lens 22 are both arranged between the semiconductor laser device 11 and the semiconductor optical amplifier 21. The laser light emitted from the semiconductor laser device 11 is spatially coupled to an incident end of the waveguide of the semiconductor optical amplifier 21 via the collimator lens 12 and the collective lens 22. This optical path from the semiconductor laser device 11 to the semiconductor optical amplifier 21 is a main optical path L1.

As illustrated in FIG. 3, the semiconductor laser module 100 includes a first beam splitter 31 and an isolator 32, both of which are arranged between the collimator lens 12 and the collective lens 22. The arrangement order between the first beam splitter 31 and the isolator 32 is not limited to the one illustrated in FIG. 3, but the first beam splitter 31 and the isolator 32 are preferably arranged at positions where the laser light between the collimator lens 12 and the collective lens 22 becomes parallel light.

The first beam splitter 31 is an optical element for branching a part of the laser light emitted from the semiconductor laser device 11, to a wavelength locker 50. The first beam splitter 31 is a general branching optical element of a prism type or a filter type. The isolator 32 is an optical element for preventing laser light from going backward along the optical path due to reflection by any optical element and being incident on the semiconductor laser device 11. The isolator 32 is able to change only an optical path of the laser light going backward by using polarizability of the laser light.

The wavelength locker 50 is a device that measures a wavelength of the laser light branched by the first beam splitter 31, and monitors the wavelength of the laser light being omitted by the semiconductor laser device 11. The wavelength of the laser light monitored by the wavelength locker 50 is fed back to the temperature control performed by the LD thermoelectric device 41, and feedback control is performed such that the semiconductor laser device 11 continues to emit the laser light of a desired wavelength.

The wavelength locker 50 includes: a second beam splitter 51; a second light receiving device 52 that directly monitors an intensity of the laser light that passes through the second beam splitter 51; and a first light receiving device 54 that monitors, via an etalon filter 53, an intensity of the laser light branched by the second beam splitter 51. The etalon filter 53 is a wavelength-dependent optical element having periodic transmission characteristics with respect to wavelength of light. Therefore, by measuring an intensity ratio between light transmitted through the etalon filter 53 and light that has not been transmitted through the etalon filter 53, a wavelength of the light is able to be determined. By using a ratio between an intensity of the laser light acquired by the first light receiving device 54 and an intensity of the laser light acquired by the second light receiving device 52, the wavelength locker 50 measures a wavelength of the laser light branched by the first beam splitter 31.

Furthermore, as illustrated in FIG. 3, in the semiconductor laser module 100, the semiconductor optical amplifier 21 is arranged behind a light receiving surface S of the first light receiving device 54. Being behind the receiving surface S means being opposite to the front of the light receiving surface S, the front being where the light receiving surface S receives light. In other words, being behind the light receiving surface S means being opposite to where the second beam splitter 51 and the etalon filter 53 are arranged, and is represented by the arrows in FIG. 3. According to the above described results of the preliminary experiments, by arranging the semiconductor optical amplifier 21 behind the light receiving surface S of the first light receiving device 54, the ASE light emitted from the semiconductor optical amplifier 21 becomes less influential on the detection by the first light receiving device 54. That is, the ASE light emitted from any position on the outer periphery of the semiconductor optical amplifier 21 is prevented from being directly incident on the light receiving surface S of the first light receiving device 54.

The semiconductor laser module 100 is preferably configured as described below, such that the semiconductor optical amplifier 21 is arranged behind the light receiving surface S of the first light receiving device 54. The first light receiving device 54 is preferably arranged to receive the laser light that has been emitted from the semiconductor laser device 11 and branched by the first beam splitter 31 arranged between the collimator lens 12 and the collective lens 22. This is because when the laser light is branched upstream of the semiconductor optical amplifier 21 along the main optical path L1 from the semiconductor laser device 11 through the semiconductor optical amplifier 21, it becomes easier for the semiconductor optical amplifier 21 to be arranged behind the light receiving surface S of the first light receiving device 54.

Furthermore, the first light receiving device 54 is preferably arranged to receive the laser light that has been branched by the first beam splitter 31 and branched further by the second beam splitter 51. With this, the second light receiving device 52 is thus configured to be able to also receive the laser light that passes through the first beam splitter 31; the optical path of the laser light entering the first light receiving device 54 and the main optical path L1 are thus arranged to be substantially parallel to each other easily; and the semiconductor optical amplifier 21 thereby becomes easier to be arranged behind the light receiving surface S of the first light receiving device 54. Therefore, the first light receiving device 54 is preferably arranged to receive the laser light that has been reflected by both the first beam splitter 31 and the second beam splitter 51.

However, the substantially parallel arrangement between the optical path of the laser light entering the first light receiving device 54 and the main optical path L1 does not necessarily require that a central axis L2 of the etalon filter 53 be parallel to the main optical path L1. For example, the central axis L2 of the etalon filter 53 may be arranged to be inclined at an angle θ in a range of ±7 degrees with respect to light incident on the etalon filter 53. By arranging the etalon filter 53 at an inclination in the range of ±7 degrees with respect to the incident light, an effect of improving the extinction ratio of wavelength characteristics of the laser light that has been transmitted through the etalon filter 53 and received by the first light receiving device 54 is achieved. Furthermore, as a result of inclining the etalon filter 53 with respect to the incident light, returned light reflected by the first light receiving device 54 is able to be prevented from being reflected by the etalon filter 53 and entering the first light receiving device 54 again.

Furthermore, a height of the etalon filter 53 is preferably higher than a position where the first light receiving device 54 receives light, the height being a height from a bottom surface of the semiconductor laser module 100 (vertical to the plane of paper of FIG. 3). Moreover, the height of the etalon filter 53 is preferably higher than that of the semiconductor optical amplifier 21, their heights being heights from the bottom surface of the semiconductor laser module 100.

Furthermore, as illustrated in FIG. 3, the semiconductor laser module 100 includes: an optical fiber 60 that guides the laser light emitted from the semiconductor optical amplifier 21, to the exterior of the semiconductor laser module 100; and a coupling optical unit 61 for coupling the laser light emitted from the semiconductor optical amplifier 21 to the optical fiber 60. The coupling optical unit 61 illustrated in FIG. 3 has been drawn as if the coupling optical unit 61 is formed of a single lens, but the coupling optical unit 61 may be configured to have a collimator lens and a collective lens, and is not necessarily arranged at the position illustrated in FIG. 3. A general single-mode glass optical fiber having adequate propagation characteristics for the laser light emitted from the semiconductor laser device 11 may be used as the optical fiber 60.

A semiconductor laser module according to the present disclosure has an effect of enabling reduction of stray light that reaches a light receiving device for monitoring laser light emitted from a semiconductor laser device.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser module, comprising:
   a semiconductor laser device;
   a semiconductor optical amplifier configured to receive and amplify laser light emitted from the semiconductor laser device;
   a collimator lens and a collective lens arranged between the semiconductor laser device and the semiconductor optical amplifier such that the laser light is spatially coupled to an incident end of a waveguide of the semiconductor optical amplifier;
   a first beam splitter arranged between the collimator lens and the collective lens and configured to provide a first portion of the laser light to a second beam splitter configured to split the first portion of the laser light into a second portion of the laser light and a third portion of the laser light;
   a wavelength-dependent optical element having a transmissivity or a reflectivity that is dependent on wavelength and arranged to receive the second portion of the laser light;
   a first light receiving device that acquires, via the wavelength-dependent optical element, the second portion of the laser light and measures an intensity of the second portion of the laser light; and
   a second light receiving device that acquires the third portion of the laser light and measures an intensity of the third portion of the laser light, wherein a wavelength of the laser light emitted from the semiconductor laser device is measured based on a ratio between the intensity of the second portion of the laser light and the intensity of the third portion of the laser light, wherein the semiconductor optical amplifier is located rearward in relation to a light receiving surface of the first light receiving device along a propagation direction of the laser light emitted from the semiconductor device, the light receiving surface of the first light receiving device does not face the semiconductor optical amplifier, and the second light receiving device is located more distant from the semiconductor optical amplifier than the first light receiving device.

2. The semiconductor laser module according to claim 1, wherein the laser light that the first light receiving device acquires the intensity for enters the first light receiving device after being reflected by the first beam splitter and the second beam splitter.

3. The semiconductor laser module according to claim 1, wherein the wavelength-dependent optical element is an etalon filter.

4. The semiconductor laser module according to claim 3, wherein the etalon filter is arranged at an inclination in a range of ±7 degrees with respect to light incident on the etalon filter.

5. The semiconductor laser module according to claim 1, wherein the wavelength of the laser light emitted by the semiconductor laser device is subjected to feedback control, based on the ratio between the intensity of the second portion of the laser light acquired by the first light receiving device and the intensity of the third portion of the laser light acquired by the second light receiving device.

6. The semiconductor laser module according to claim 5, further comprising:
   a thermoelectric device that controls a temperature of the semiconductor laser device, wherein the thermoelectric device is subjected to feedback control, based on the ratio between the intensity of the second portion of the laser light acquired by the first light receiving device and the intensity of the third portion of the laser light acquired by the second light receiving device.

* * * * *